United States Patent
Deimling et al.

(10) Patent No.: US 7,385,399 B2
(45) Date of Patent: Jun. 10, 2008

(54) RADIO-FREQUENCY ANTENNA ARRANGEMENT FOR ACQUISITION OF A MAGNETIC RESONANCE SIGNAL

(75) Inventors: Michael Deimling, Möhrendorf (DE); Arne Reykowski, Gainesville, FL (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/679,235

(22) Filed: Feb. 27, 2007

(65) Prior Publication Data

US 2007/0236219 A1   Oct. 11, 2007

(30) Foreign Application Priority Data

Feb. 27, 2006   (DE)   ..................... 10 2006 009 043

(51) Int. Cl.
*G01V 3/00*   (2006.01)
(52) U.S. Cl. ...................................... 324/318; 324/322
(58) Field of Classification Search ........ 324/300–322; 600/410, 422, 407
See application file for complete search history.

(56) References Cited

U.S. PATENT DOCUMENTS

| | | | |
|---|---|---|---|
| 5,841,278 A * | 11/1998 | Green et al. ................. | 324/318 |
| 6,184,684 B1 * | 2/2001 | Dumoulin et al. .......... | 324/318 |
| 6,335,622 B1 * | 1/2002 | James et al. ................. | 324/318 |
| 6,906,520 B2 * | 6/2005 | Heid et al. ................... | 324/322 |
| 6,930,482 B2 * | 8/2005 | Heid et al. ................... | 324/318 |
| 7,268,554 B2 * | 9/2007 | Vaughan ..................... | 324/322 |
| 2006/0287705 A1 * | 12/2006 | Weber ......................... | 623/1.15 |
| 2007/0279061 A1 * | 12/2007 | Erickson et al. ............ | 324/322 |
| 2008/0001602 A1 * | 1/2008 | Schiano et al. ............. | 324/318 |

FOREIGN PATENT DOCUMENTS

| | | |
|---|---|---|
| EP | 1 624 314 | 2/2006 |
| WO | WO 03/044892 | 5/2003 |

* cited by examiner

*Primary Examiner*—Brij B Shrivastav
(74) *Attorney, Agent, or Firm*—Schiff Hardin LLP (57) ABSTRACT

A radio-frequency antenna for acquisition of a magnetic resonance signal has two electrodes that are connected with one another via a discrete tuning device. The first radio-frequency antenna) is tuned to a resonance frequency by the tuning device. The tuning device has a first tuning element influencing the resonance frequency of the radio-frequency antenna and a second tuning element influencing the resonance frequency of the first radio-frequency antenna. The tuning elements are connected in series and fashioned as inductors. The radio-frequency antenna also has two tap points at which an acquisition signal representative of the acquired magnetic resonance signal is tapped and conducted away via feed lines. The tap points are respectively arranged between the electrodes and the tuning element and one of said tap points is between the first and second tuning elements.

25 Claims, 8 Drawing Sheets

FIG 5 Support Structure

Support Structure

RADIO-FREQUENCY ANTENNA ARRANGEMENT FOR ACQUISITION OF A MAGNETIC RESONANCE SIGNAL

BACKGROUND OF THE INVENTION

1. Field of the Invention

The present invention concerns a radio-frequency antenna arrangement for acquisition of a magnetic resonance signal.

2. Description of the Prior Art

Magnetic resonance signals are very weak signals. A good signal-to-noise ratio (SNR) is therefore of decisive importance for a qualitatively high-grade evaluation of the magnetic resonance signals acquired by a radio-frequency antenna in a magnetic resonance system. In the prior art significant efforts are made in order to optimize the SNR.

Radio-frequency antennas for magnetic resonance signals are always fashioned in the prior art as antennas that acquire the magnetic component of the electromagnetic signals that arise due to magnetic resonance. They are tuned to a resonance frequency by capacitors. The resonance frequency corresponds in the ideal case to the Larmor frequency of the magnetic resonance system. The radio-frequency antennas are fashioned, for example, as a single winding or as a group of windings, as a saddle coil, as a birdcage resonator, etc. In magnetic resonance systems with a basic magnetic field up to approximately 1.5 T, good SNR can be achieved for most purposes with such radio-frequency antennas. In practice the actual achieved SNR lies relatively close to the theoretically possible SNR.

More recently, magnetic resonance systems have been developed with higher basic magnetic fields, for example with basic magnetic fields of 3 T, 5T or even more. In these magnetic resonance systems it has surprisingly occurred that the SNR achieved in practice always lags further behind the theoretical optimum. The SNR therefore must be improved in order to enable a qualitatively high-grade evaluation of the magnetic resonance signal.

A dipole antenna that is divided into two dipole halves is known from WO 03/044892 A1. The dipole halves are connected with one another by an inductor. A signal acquired from the dipole antenna is tapped via the inductor.

A radio-frequency antenna arrangement for acquisition of a magnetic resonance signal is known from EP 1 624 314 A1. The radio-frequency antenna has two electrodes that are connected with one another by a discrete tuning device. The radio-frequency antenna is tuned to a resonance frequency by the tuning device. The tuning device has a tuning element that influences the resonance frequency of the radio-frequency antenna, this tuning element functioning as an inductor. The radio-frequency antenna furthermore has two tap points at which an acquisition signal representative of the acquired magnetic resonance signal is tapped and conducted away via feed lines. One of the tap points is arranged between each of the electrodes and the tuning element.

SUMMARY OF THE INVENTION

An object of the present invention is to provide a radio-frequency antenna arrangement that allows a good SNR to be accomplished at least for high basic magnetic fields, but also independent of the strength of the basic magnetic field.

The object is achieved by a radio-frequency antenna arrangement having a radio-frequency antenna with two electrodes that are connected with one another by a discrete tuning device. The radio-frequency antenna is tuned to a resonance frequency by the tuning device. The tuning device has a first tuning element that influences the resonance frequency of the radio-frequency antenna and a second tuning element that influences the resonance frequency. The tuning elements are connected in series and fashioned as inductors. The radio-frequency antenna furthermore has two tap points at which an acquisition signal representative of the acquired magnetic resonance signal is tapped and conducted away via feed lines. The tap points are respectively arranged between the electrodes and the first tuning element and one of the tap points is between the first tuning element and the second tuning element.

Due to the presence of the electrodes acting as a capacitor, the radio-frequency antenna is no longer sensitive to the magnetic component of the magnetic resonance signal, but rather to its electrical component. Due to the circumstance that an LC combination is required for tuning to the resonance frequency, the tuning elements are therefore fashioned as inductors. Due to the presence of two tuning elements, a symmetrical design of the radio-frequency antenna is possible. This particularly applies when the first tuning element and the second tuning element exhibit the same inductance values.

The electrodes can be fashioned identically. For example, the electrodes can be curved towards one another such that they form between them a convex acquisition (acceptance) volume for an examination subject and the radio-frequency antenna exhibits an essentially location-independent sensitivity within the convex acquisition volume. Alternatively, it is also possible, for example, for the electrodes to each exhibit a longitudinal element and a transverse element, with the longitudinal elements aligned with one another and exhibiting ends facing towards one another and ends facing away from one another, and with the transverse elements arranged centrally at the ends of the longitudinal elements facing away from one another. In this case the radio-frequency antenna is fashioned as an optimized surface antenna.

The electrodes can also be fashioned dissimilarly. In this case one of the electrodes can be curved around a focal point. The other of the electrodes can be arranged, for example, in proximity to the focal point, in particular in the focal point itself. It is also possible for the other of the electrodes to be tapered such that the radio-frequency antenna exhibits a higher sensitivity in the region of the tip of this other electrode than further away from the tip. In this case the focal point can alternatively be arranged between the electrodes, or the non-tapered electrode can even be arranged around a connecting line that is defined by the focal point and the tip of the tapered electrode.

The radio-frequency antenna can be constructed in various ways. The radio-frequency antenna arrangement preferably exhibits a support structure on which at least the radio-frequency antenna is arranged, such that the radio-frequency antenna arrangement can be considered as (installation) module or application unit.

A second radio-frequency antenna can also be arranged on the support structure in addition to the aforementioned radio-frequency antenna (in this embodiment now referred to as a first radio-frequency antenna). The second radio-frequency antenna can be fashioned just like the first radio-frequency antenna. In this case the second radio-frequency antenna can be arranged parallel to the first radio-frequency antenna. Array structures and birdcage-like structures can be realized with such a design. Alternatively, the first radio-frequency antenna and the second radio-frequency antenna can be arranged such that they acquire components of the magnetic resonance signal that are linearly-polarized perpendicular to one another. In this case a combination of the two linearly-polarized signals into a circularly-polarized sum signal is in particular possible.

The combination into the sum signal is possible in a particularly simple manner in an embodiment wherein the first radio-frequency antenna and the second radio-frequency antenna exhibit a common tap point; one of the tap points of the first radio-frequency antenna is thus also one of the tap points of the second radio-frequency antenna.

The second radio-frequency antenna can have a coil with at least one conductor loop that is tuned to the resonance frequency by a discrete second tuning device. In this case the second tuning device has at least one second tuning element influencing the resonance frequency of the second radio-frequency antenna, this second tuning element being fashioned as a capacitor. The magnetic portion of the magnetic resonance signal is detected in a conventional manner by means of the second radio-frequency antenna. This embodiment is particularly suitable for medium basic magnetic fields (strength approximately 2 to 7 T).

It is possible for the first radio-frequency antenna and the second radio-frequency antenna to be separated from one another. In this case the second radio-frequency antenna preferably surrounds the first radio-frequency antenna.

In a further preferred embodiment a third radio-frequency antenna is also arranged on the support structure in addition to the first radio-frequency antenna and the second radio-frequency antenna. The third radio-frequency antenna is fashioned just like the second radio-frequency antenna, with the second radio-frequency antenna and the third radio-frequency antenna being connected with one another via the tuning element of the first radio-frequency antenna. In this case an advantageous embodiment results is for the second radio-frequency antenna and the third radio-frequency antenna to be decoupled from one another via a capacitive network and the first tuning element suppresses a common mode signal between the second radio-frequency antenna and the third radio-frequency antenna.

It is possible to arrange adaptation capacitors not only in one but rather in both feed lines of the first radio-frequency antenna. It is possible to arrange the adaptation capacitors (possibly including a detuning circuit) on the support structure.

DESCRIPTION OF THE PREFERRED EMBODIMENTS

Figure 1:
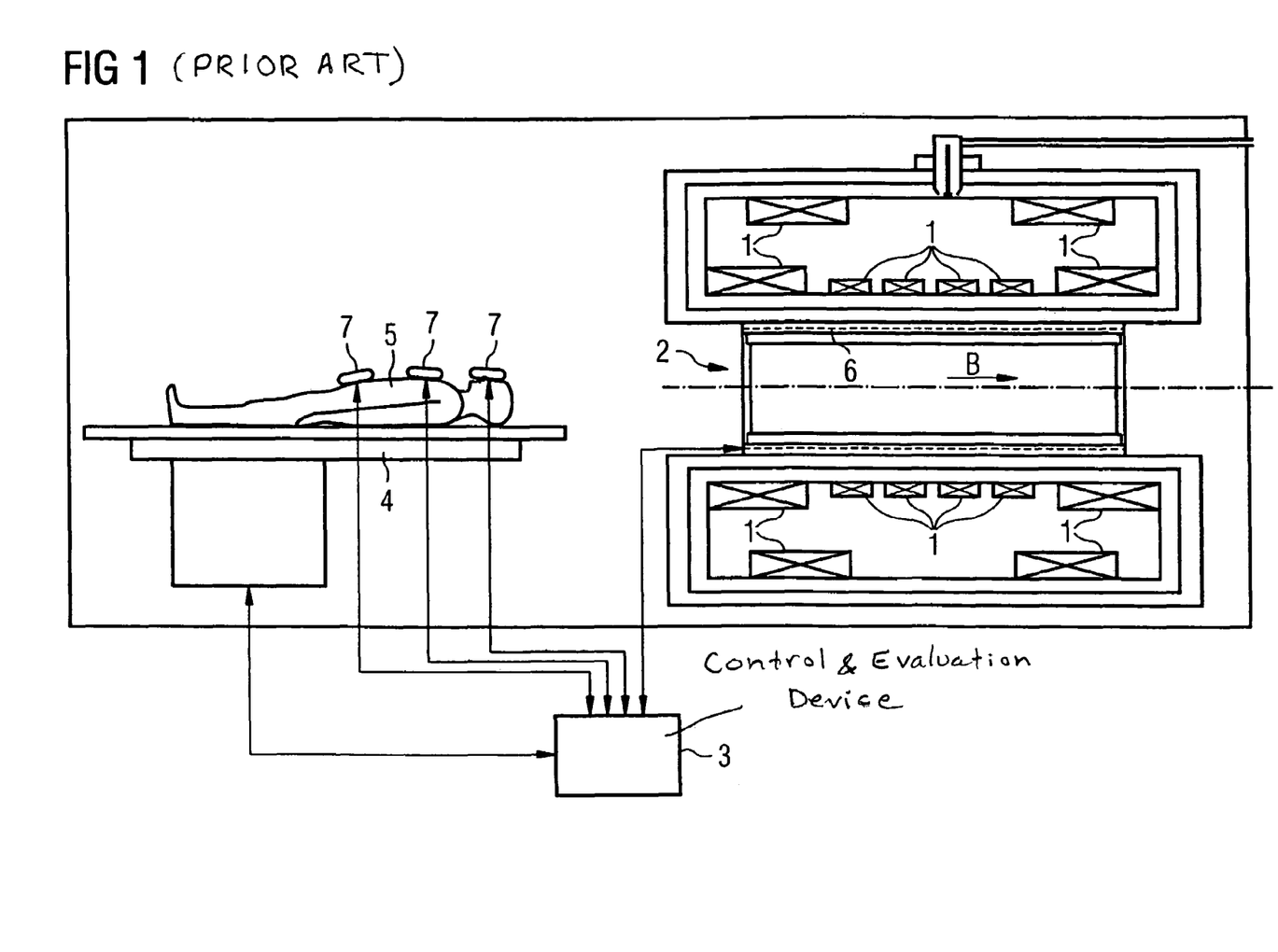
FIG. 1 schematically shows a magnetic resonance system in which the inventive radio-frequency antenna arrangement can be used.

According to FIG. 1 a magnetic resonance system as is generally typical, has a basic magnet system 1. The basic magnet system 1 generates a temporally constant basic magnetic field B that is essentially spatially homogeneous within an examination volume 2. The strength of the basic magnetic field B within the examination volume 2 amounts to at least 1.5 T, advantageously 3 T or more.

The magnetic resonance examination system also has a control and evaluation device 3 that controls the operation of the magnetic resonance system. Among other things, the control and evaluation device 3 controls a patient bed 4 by means of which an examination subject (normally a person 5) can be inserted into and directed out from the examination volume 2. The control and evaluation device 3 also operates a gradient coil system that is conventionally present.

The control and evaluation device 3 is furthermore connected with a whole-body antenna 6. The whole-body antenna 6 is a radio-frequency antenna by means of which magnetic resonance signals can be excited in the examination subject 5 when the examination subject 5 is inserted into the examination volume 2. Excited magnetic resonance signals can also be acquired (received) by means of the whole-body antenna 6. The whole-body antenna 6 is a radio-frequency antenna in the sense of the present invention, at least for acquisition purposes.

The magnetic resonance system of FIG. 1 has a number of local antennas 7. The local antennas 7 are also radio-frequency antennas in the sense of the present invention, by means of which local antennas 7 a magnetic resonance signal can be acquired. The local antennas 7 are also connected with the control and evaluation device 3.

Various embodiments of the whole-body antenna 6 and the local antennas 7 are described in the following. Insofar as it is not expressly mentioned otherwise, the subsequently described embodiments can be both embodiments of the whole-body antenna 6 and embodiments of the local antennas 7, or of the multiple local antennas 7. Particularly in the case of the whole-body antenna 6, the radio-frequency antennas subsequently described can furthermore be used not only as acquisition antennas for acquisition of an already-excited magnetic resonance signal but also as transmission antennas for excitation of such a magnetic resonance signal.

Starting from basic principles, an inventively designed radio-frequency antenna (provided with the reference character 8 from FIG. 2) has two electrodes 9, 10 that are connected with one another via a discrete tuning device 11. The radio-frequency antenna 8 is tuned to a resonance frequency by means of the discrete tuning device 11, in the present case advantageously to the Larmor frequency of the magnetic resonance system. For this purpose the tuning device has at least one first tuning element 12 that influences the resonance frequency of the radio-frequency antenna 8. Due to the circumstance that the radio-frequency antenna 8 has two electrodes 9, 10 (thus elements in which not the inductance but rather the capacitance is the dominating component), the first tuning element 12 is fashioned as an inductor. The radio-frequency antenna 8 is also sensitive to the electrical components of the excited magnetic resonance signal. This stands in contrast to typical radio-frequency antennas for magnetic resonance systems in which the magnetic component is always detected.

Figure 2:
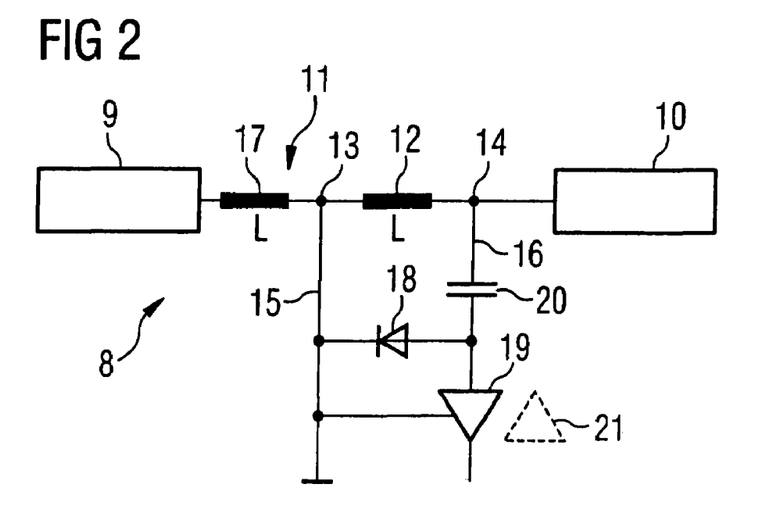
FIGS. 2 through 14 respective show various embodiments of the inventive radio-frequency antenna arrangement.

Like every other radio-frequency antenna for magnetic resonance applications, the radio-frequency antenna 8 of FIG. 2 exhibits two tap points 13, 14 at which an acquisition signal can be tapped in the event of acquisition, the acquisition signal representing the magnetic resonance signal acquired by the radio-frequency antenna 8. This acquisition signal is conducted away via feed lines 15, 16, in the present case to the control and evaluation device 3. According to the invention the tap points 13, 14 are arranged on both sides of the first tuning element 12. One of the tap points 13, 14 is thus arranged between each of the electrodes 9, 10 and the first tuning element 12.

According to FIG. 2 the tuning device 11 furthermore has a second tuning element 17 that likewise influences the resonance frequency and is likewise fashioned as an inductor. In the present case the first and second tuning elements 12, 17 are connected in series and exhibit the same inductance values L. The second tuning element 17 is thus arranged between one of the electrodes 9, 10 and the first tuning element 12. The tap point 13 arranged between this electrode 9 and the first tuning element 12 is clearly arranged between the first and the second tuning elements 12, 17. This embodiment exhibits advantages due to its symmetry, but is not necessary.

According to FIG. 2 the feed lines 15, 16 are connected with one another via a diode 18. The diode 18 is advantageously fashioned as a PIN diode and serves as a blocking element by means of which a pre-amplifier 19 can, if applicable, be separated (in terms of signal) from the radio-frequency antenna 8. As needed, the PIN diode 18 is controlled by the control and evaluation device 3.

Furthermore, an adaptation capacitor 20 is arranged in the feed line 16 that leads to the preamplifier 19. The preamplifier 19 is coupled in a high-ohmic manner to the radio-frequency antenna 8 by means of the adaptation capacitor 20.

The (in principle) identical embodiment could also be used for emission of an excitation signal for excitation of magnetic resonance. Only the preamplifier 19 would have to be replaced by a power amplifier 21. This is indicated dashed in FIG. 2. An alternative operation in which the preamplifier 19 and the power amplifier 21 can be activated in alternation at the radio-frequency antenna 8 via a suitable coupling element is generally known.

The subsequent embodiments described in connection with FIGS. 3 through 14 are all based on the basic principle explained in the preceding in connection with FIG. 2. FIG. 2 and the statements regarding FIG. 2 are thus applicable as well, even if not expressly mentioned in connection with the descriptions of FIGS. 3 through 14.

Figure 3:
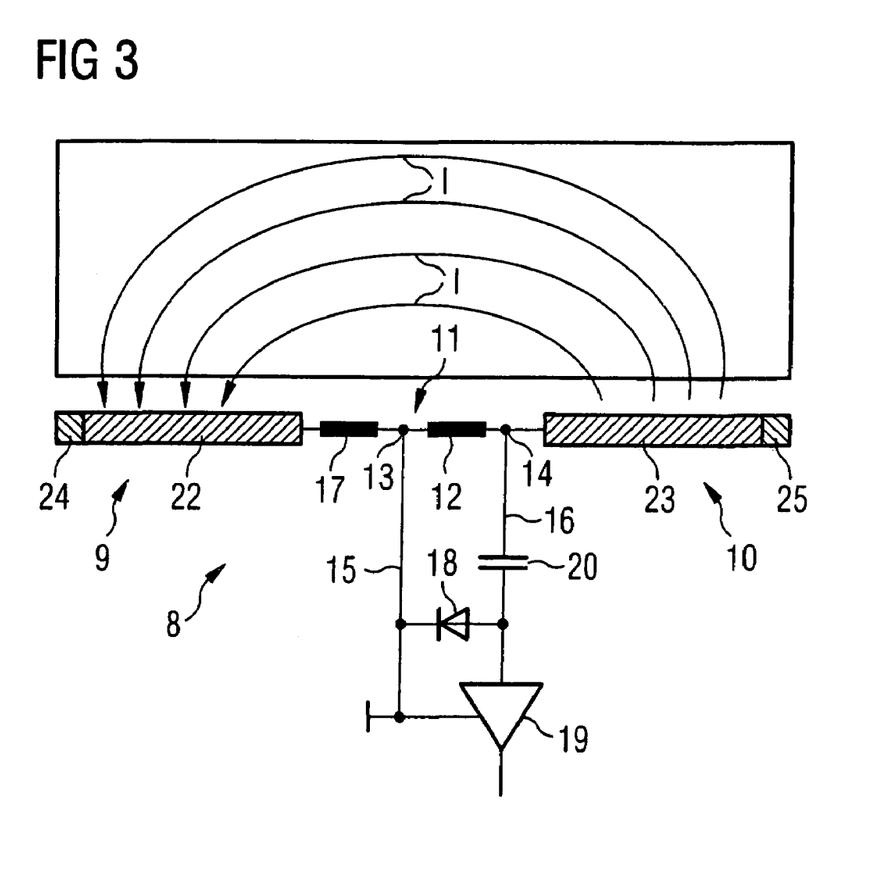
Figure 4:
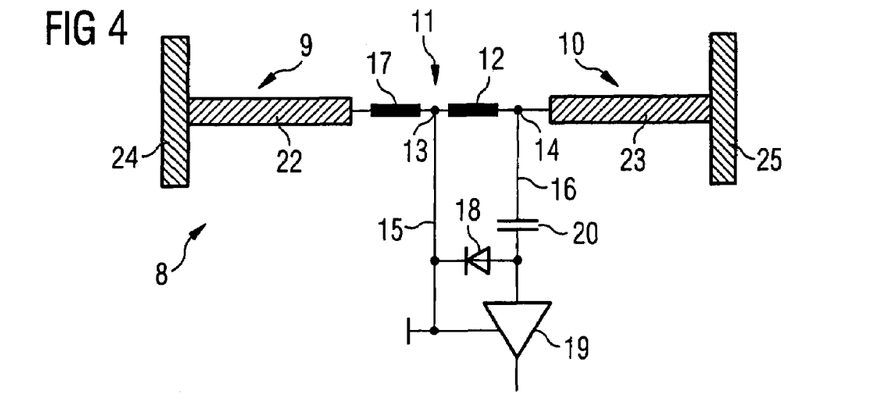

FIGS. 3 and 4 show a radio-frequency antenna 8 that is fashioned as a surface antenna. In this radio-frequency antenna 8 the electrodes 9, 10 are fashioned identically and arranged on the same side of the examination subject 5. They have at least longitudinal elements 22, 23 that are aligned with one another. Furthermore, field lines which should indicate the curve of a displacement current I at a specific point in time are drawn as well in FIG. 3.

As is particularly apparent from FIG. 4, the electrodes 9, 10 can also contain transverse elements 24, 25 in addition to the longitudinal elements 22, 23. The presence of the transverse elements 24, 25 increases the sensitivity of the radio-frequency antenna 8. The transverse elements 24, 25, however, are not necessary.

If the transverse elements 24, 25 are present, they are advantageously centrally arranged at the ends of the longitudinal elements 22, 23 facing away from one another. The electrodes 9, 10 thus form a T-shaped profile. For completeness it is also noted that the electrodes 9, 10 in the remaining FIG. can also comprise the transverse elements 24, 25 (only the transverse elements 24, 25 are shown there) and, conversely, can include only longitudinal elements 22, 23 in the FIG. 4 insofar as there both the longitudinal elements 22, 23 and the transverse elements 24, 25 are shown.

The individual elements 9 through 14 of the radio-frequency antenna 8 can be arranged on various support elements, but a common support structure 26 is preferably used on which the entire radio-frequency antenna 8 is arranged. The radio-frequency antenna 8 can thus be treated as a mounting module or application unit.

The embodiments according to FIGS. 5 through 8 are based on the radio-frequency antenna 8 of FIGS. 3 and 4.

Figure 5:
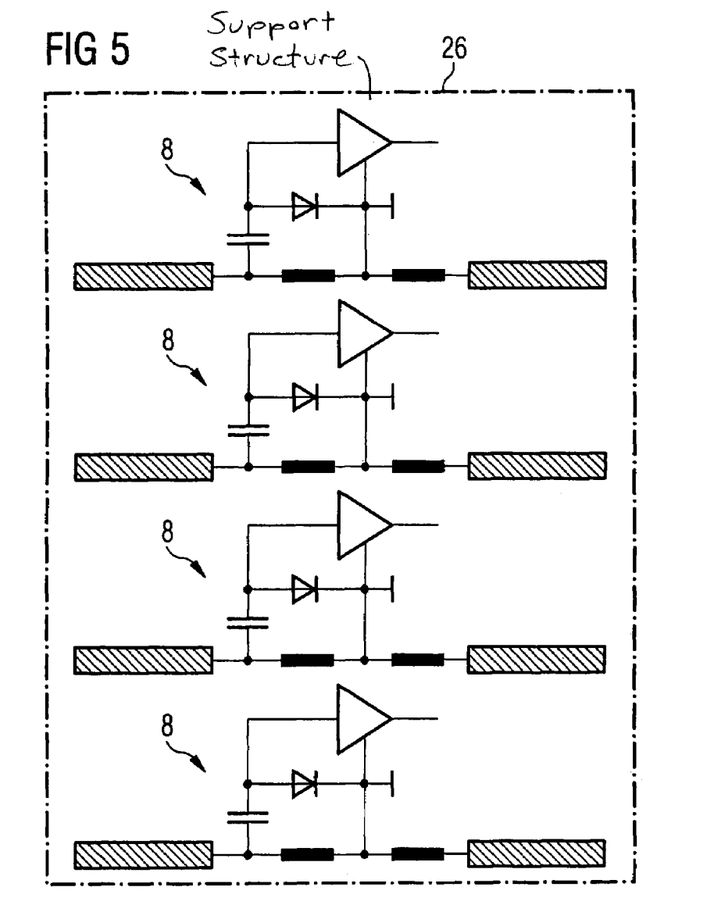
Figure 6:
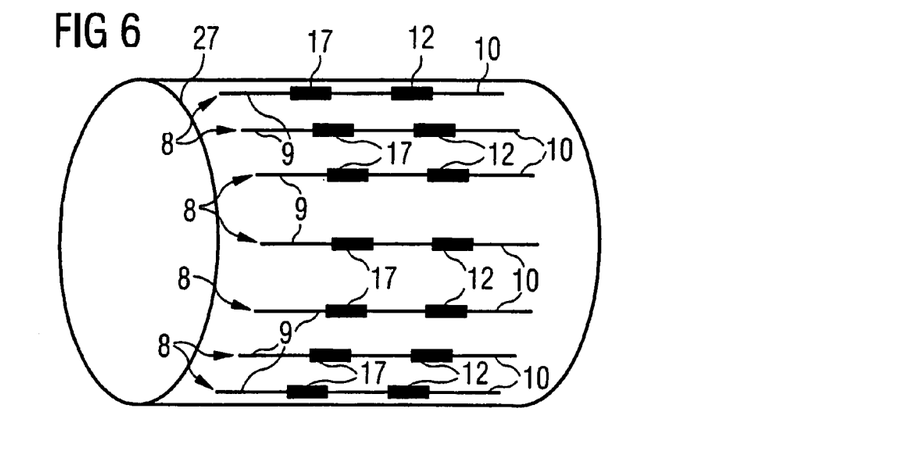
Figure 7:
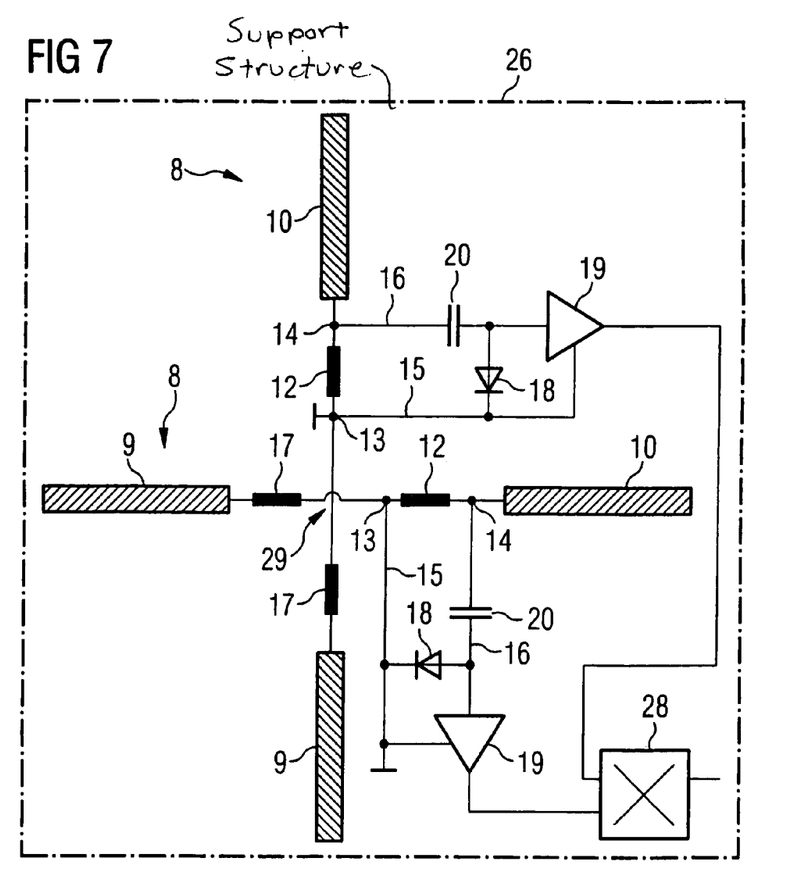

According to FIGS. 5 through 7, a number of radio-frequency antennas 8 are arranged on the support structure 26. The radio-frequency antennas 8 are fashioned identically among one another. In FIGS. 5 and 6 more than two radio-frequency antennas 8 are arranged next to one another such that an array of radio-frequency antennas 8 is realized. Exactly two radio-frequency antennas 8 are present in the embodiment according to FIG. 7.

The radio-frequency antennas 8 of FIG. 5 are arranged in parallel and next to one another on an (advantageously flexible) support structure 26. The radio-frequency antennas 8 of FIG. 6 are arranged in parallel and next to one another on a cylindrical jacket 27. They are thus arranged analogous to the antenna rods of a birdcage resonator. The embodiment according to FIG. 6 is in particular also suitable as a transmission antenna array.

The radio-frequency antennas 8 of FIG. 7 are arranged such that they acquire components of the magnetic resonance signal that are linearly-polarized perpendicular to one another. Both acquisition signals therefore can be combined in a typical combiner 28 into a circularly-polarized sum signal. Due to the symmetric embodiment of the radio-frequency antennas 8 of FIG. 7, the two radio-frequency antennas 8 can exhibit a common tap point that, for example, replaces the tap points 13 and electrically connects the two radio-frequency antennas 8 with one another in an intersection region 29.

Figure 8:
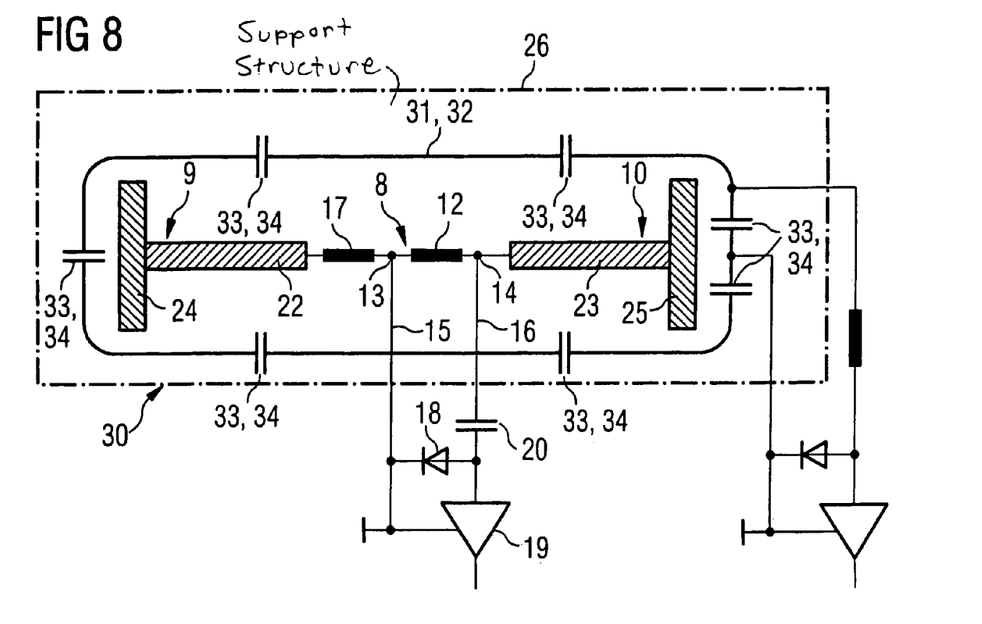

In the embodiment according to FIG. 8 a number of radio-frequency antennas 8, 30 are likewise arranged on the support structure 26. One of the radio-frequency antennas, namely the radio-frequency antenna 8, is fashioned according to FIGS. 3 and 4. The other radio-frequency antenna 30 is fashioned differently. It acquires the magnetic portion of the magnetic resonance signal. The further radio-frequency antenna 30 therefore has a coil 31 with at least one conductor loop 32, with the coil 32 being tuned to the resonance frequency by a discrete second tuning device 33. For this purpose the second tuning device 33 has a tuning element 34 that influences the resonance frequency of the further radio-frequency antenna 30 and is fashioned as a capacitor.

According to FIG. 8, the two radio-frequency antennas 8, 30 are separated from one another. According to FIG. 8, the further radio-frequency antenna 30 which detects the magnetic portion of the magnetic resonance signal surrounds the inventive radio-frequency antenna 8 which detects the electrical portion of the magnetic resonance signal.

Figure 9:
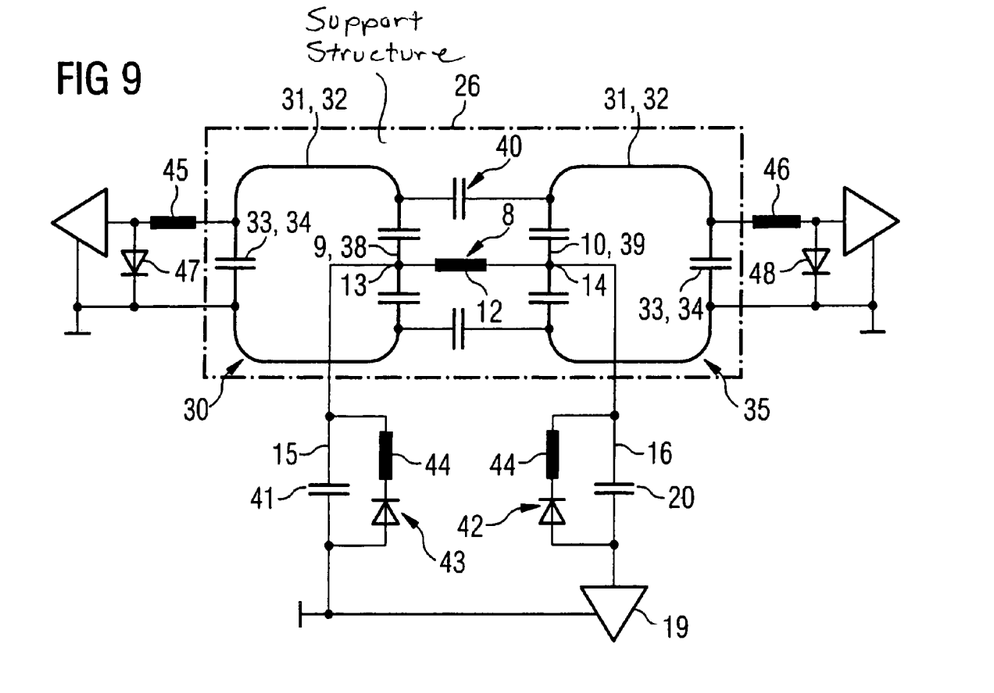

In the embodiment according to FIG. 9, in total three radio-frequency antennas 8, 30, 35 are arranged on the support structure 26, these three radio-frequency antennas 8, 30, 35 being designated herein as a first radio-frequency antenna 8, a second radio-frequency antenna 30 and a third radio-frequency antenna 35 for differentiation from one another. The second and the third radio-frequency antennas 30, 35 are fashioned identically. They both have the elements 31 through 34 of the radio-frequency antenna 30 described in the preceding in connection with FIG. 8. They are thus tuned to the resonance frequency by discrete tuning devices 33. The tuning devices 33 respectively are formed by at least one tuning element 34 that influences the resonance frequency of the second or third radio-frequency antenna 30, 35 and is fashioned as a capacitor. The magnetic component of the magnetic resonance signal is acquired with these radio-frequency antennas 30, 35.

The first radio-frequency antenna 8 corresponds to the radio-frequency antenna 8 of FIG. 2. In this embodiment the electrodes 9, 10 include at least conductor segments 38, 39 of the second and the third radio-frequency antennas 30, 35. The second and the third radio-frequency antennas 30, 35 are thus connected with one another via the tuning element 12 of the first radio-frequency antenna 8. The electrodes 9, 10 can possibly also include further elements of the second and the third radio-frequency antennas 30, 35. In the extreme case, the electrodes 9, 10 are identical with the second and the third radio-frequency antennas 30, 35.

A capacitive network is present in the embodiment according to FIG. 9. The capacitive network 40 decouples the second and the third radio-frequency antennas 30, 35 from one another. In this embodiment the tuning element 12 of the first radio-frequency antenna 8 suppresses a common mode signal between the second and the third radio-frequency antennas 30, 35. Such an embodiment is described in German patent application 10 2004 046 188.0.

The radio-frequency antenna from FIG. 9 is fashioned entirely symmetrical. Adaptation capacitors 20, 41 as well as detuning circuits 42, 43 are therefore arranged in both feed lines 15, 16 in it. The latter detuning circuits 42, 43 are respectively realized by an inductor 44 and a PIN diode 18.

Figure 10:
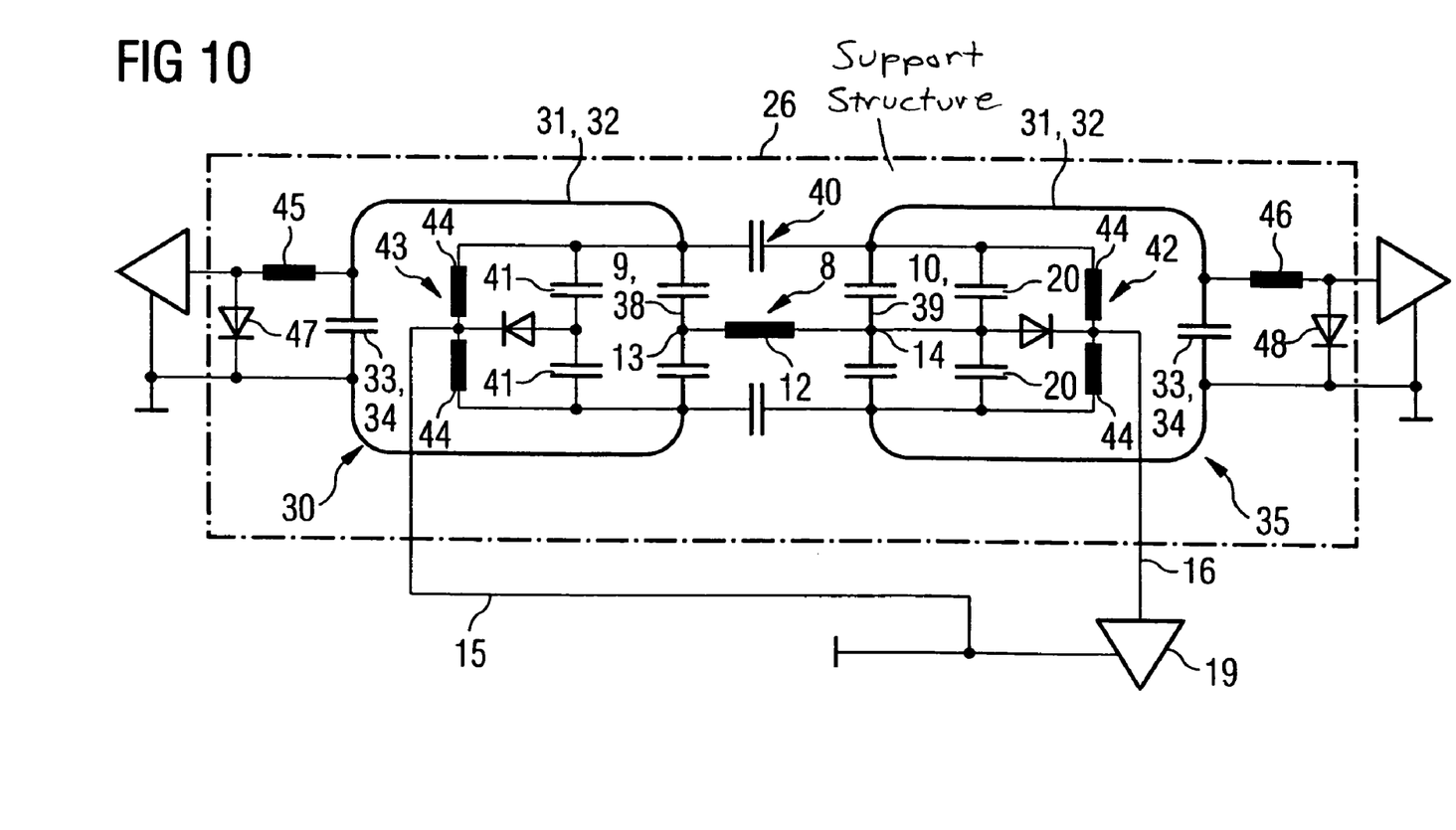

The embodiment from FIG. 10 essentially corresponds to the embodiment from FIG. 9. In contrast to the embodiment from FIG. 9, however, in the embodiment from FIG. 10 the adaptation capacitors 20, 41 and the detuning circuits 42, 43 of the first radio-frequency antenna 8 are arranged on the support structure 2 as well. Adaptation coils 45, 46 and detuning circuits 47, 48 of the second and the third radio-frequency antennas 30, 35 can possibly also be arranged as well on the support structure 26.

The embodiments of FIGS. 3 through 10 all concern surface antennas, thus embodiments in which the radio-frequency antennas 8, 30, 35 are arranged on one side of the examination subject 5. In these embodiments the electrodes 9, 10 of the radio-frequency antenna 8 are advantageously always fashioned identically. In contrast to this, the embodiments of FIGS. 11 through 14 concern volume antennas, thus antennas in which the examination subject 5 is arranged between the electrodes 9, 10 of the radio-frequency antenna 8. In these embodiments the electrodes 9, 10 are fashioned identically only in the embodiment according to FIG. 11. The electrodes 9, 10 are fashioned dissimilarly in the embodiments according to FIGS. 12 through 14.

Figure 11:
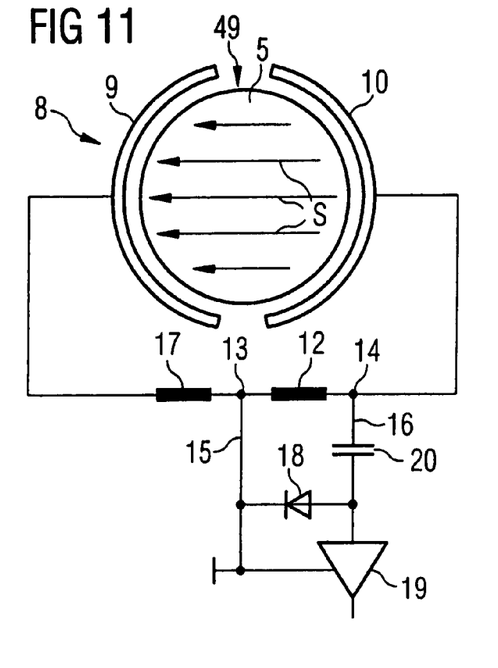

According to FIG. 11 the electrodes 9, 10 are curved towards one another and thereby form a convex acquisition volume 49 between them for the examination subject 5. Within the acquisition volume 49, the radio-frequency antenna 8 exhibits an essentially location-independent sensitivity S. Location-independent sensitivity S, means a sensitivity S that fluctuates by a maximum of 20% within the acquisition volume 49 relative to the maximum sensitivity.

Figure 12:
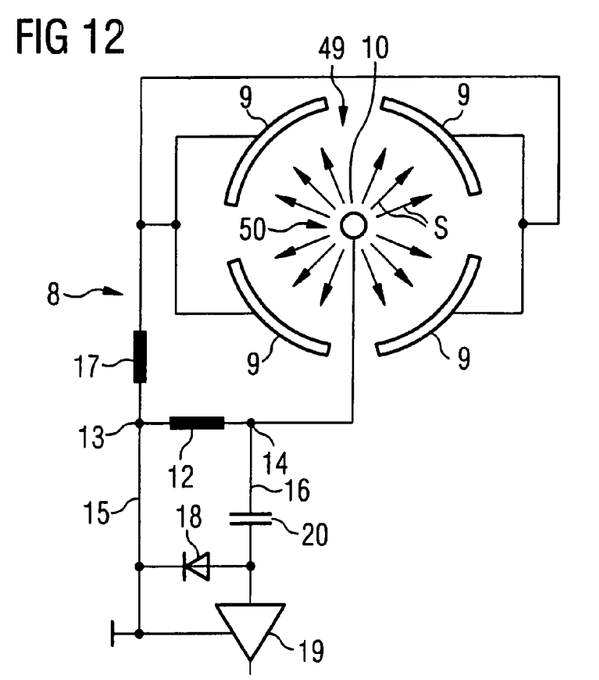
Figure 13:
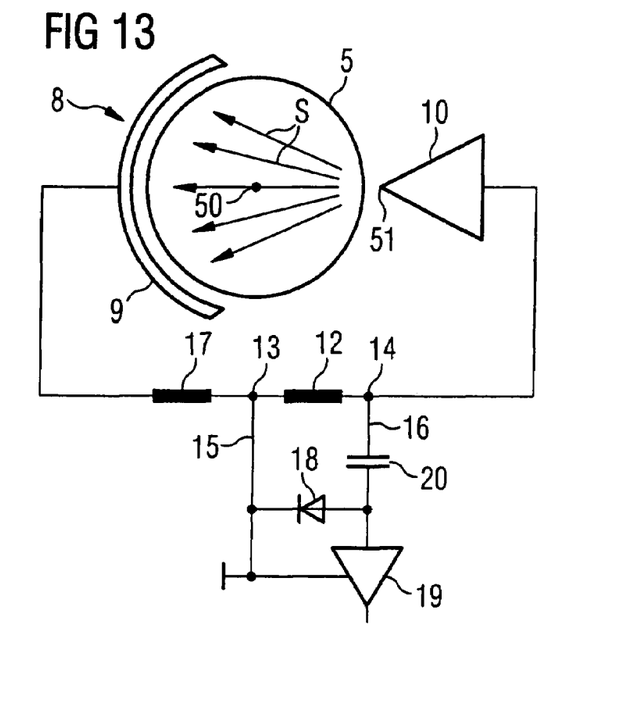
Figure 14:
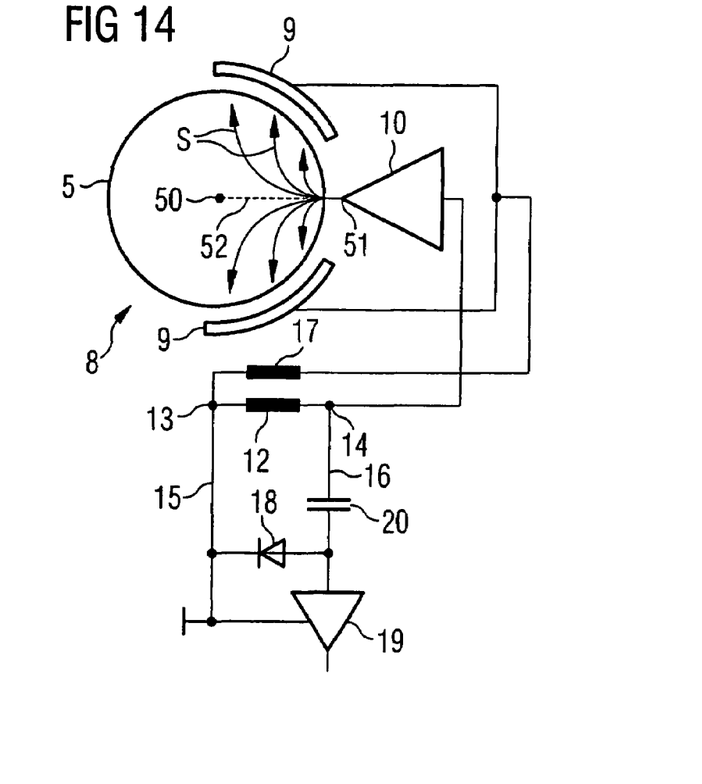

According to FIGS. 12 through 14, one of the electrodes 9, 10 (for example the electrode 9) is curved around a focal point 50. The other electrode 10 is fashioned differently.

According to FIG. 12, the other electrode 10 is arranged at the focal point 50 or in its proximity. Such an embodiment can be suitable for examinations to be conducted in proximity to the pubic region of the examination subject 5 or in the anus.

According to FIGS. 13 and 14 the other electrode 10 is fashioned tapered. The radio-frequency antenna 8 thereby exhibits a higher sensitivity S in the region of the point 51 than further away from the point 51.

In the embodiment from FIG. 13, the focal point 50 is arranged between the electrodes 9, 10. In contrast to this, in the embodiment from FIG. 14 the electrode curved around the focal point 50 is arranged around a connecting line 52 that is defined by the focal point 50 and the point 51 of the other electrode 10.

The inventive radio-frequency antenna 8 can in principle be used in all magnetic resonance systems. Use in magnetic resonance examination systems with high basic magnetic fields B (3 T and above) is particularly advantageous in connection with conventional local coils (see in particular FIGS. 8 through 10) and given small radio-frequency antennas (for example for eye antennas or intravascular antennas).

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency antenna arrangement for acquisition of a magnetic resonance signal, comprising:
   a radio-frequency antenna comprising two electrodes connected with each other via a discrete tuning device that tunes said radio-frequency antenna to a resonance frequency;
   said tuning device comprising a first tuning element that influences said resonant frequency of said radio-frequency antenna and a second tuning element that influences said resonance frequency of said radio-frequency antenna, said first and second tuning elements being connected in series and respectively functioning as inductors; and
   said radio-frequency antenna comprising two tap points at which a signal acquired by said radio-frequency antenna representing a magnetic resonance signal is tapped and conducted from said radio-frequency antenna via respective feed lines connected to said two tap points, the two tap points being respective between said electrodes and said first tuning element, and one of said tap points being between said first tuning element and said second tuning element.

2. A radio-frequency antenna arrangement as claimed in claim 1 wherein said first tuning element and said second tuning element each function with equal inductance values.

3. A radio-frequency antenna arrangement as claimed in claim 1 comprising an adaptation capacitor connected in at least one of said feed lines.

4. A radio-frequency antenna arrangement as claimed in claim 1 wherein said electrodes are identical.

5. A radio-frequency antenna arrangement as claimed in claim 4 wherein said electrodes are curved toward each other to form a convex acquisition volume for an examination subject, and wherein said radio-frequency antenna has a substantially location-independent sensitivity within said convex acquisition volume.

6. A radio-frequency antenna arrangement as claimed in claim 4 wherein each of said electrodes comprises a longitudinal element and a transverse element, the respective longitudinal elements of the electrodes being aligned with each other and the respective transverse elements of the electrodes being disposed centrally at respective ends of the longitudinal elements facing away from each other.

7. A radio-frequency antenna arrangement as claimed in claim 1 wherein said electrodes are dissimilar.

8. A radio-frequency antenna arrangement as claimed in claim 7 wherein one of said electrodes is curved around a focal point.

9. A radio-frequency antenna arrangement as claimed in claim 8 wherein another of said electrodes is disposed at or in proximity to said focal point.

10. A radio-frequency antenna arrangement as claimed in claim 8 wherein another of said electrodes is tapered to form an electrode tip, causing said radio-frequency antenna to have a higher sensitivity in a region of said electrode tip than farther away from said electrode tip.

11. A radio-frequency antenna arrangement as claimed in claim 10 wherein said focal point is located between said electrodes.

12. A radio-frequency antenna arrangement as claimed in claim 10 wherein said one of said electrodes is disposed around a connecting line defined by said focal point and said electrode tip.

13. A radio-frequency antenna arrangement as claimed in claim 1 comprising a support structure on which said radio-frequency antenna is supported, forming a radio-frequency antenna arrangement module.

14. A radio-frequency antenna arrangement as claimed in claim 13 wherein said radio-frequency antenna is a first radio-frequency antenna, and wherein said radio-frequency antenna arrangement comprises a second radio-frequency antenna supported on said support structure.

15. A radio-frequency antenna arrangement as claimed in claim 14 wherein said second radio-frequency antenna is identical to said first radio-frequency antenna.

16. A radio-frequency antenna arrangement as claimed in claim 15 wherein said second radio-frequency antenna is connected in parallel with said first radio-frequency antenna.

17. A radio-frequency antenna arrangement as claimed in claim 15 wherein said first and second radio-frequency antennas are oriented relative to each other to respectively acquire respective components of said magnetic resonance signal that are perpendicular to each other.

18. A radio-frequency antenna arrangement as claimed in claim 17 wherein one of said tap points of said first radio-frequency antenna forms one of the tap points of the second radio-frequency antenna.

19. A radio-frequency antenna arrangement as claimed in claim 14 wherein said discrete tuning device is a discrete first tuning device, and wherein said second radio-frequency antenna comprises a coil having at least one conductor loop tuned to said resonance frequency by a discrete second tuning device, said second tuning device comprising at least one second tuning device tuning element that influences the resonance frequency of the second radio-frequency antenna, said second tuning device tuning element functioning as a capacitor.

20. A radio-frequency antenna arrangement as claimed in claim 19 wherein said first and second radio-frequency antennas are separate from each other.

21. A radio-frequency antenna arrangement as claimed in claim 20 wherein said second radio-frequency antenna surrounds said first radio-frequency antenna.

22. A radio-frequency antenna arrangement as claimed in claim 19 comprising a third radio-frequency antenna identical to said second radio-frequency antenna and supported on said support structure, said second and third radio-frequency antennas being connected to each other via said first tuning element of said first radio-frequency antenna.

23. A radio-frequency antenna arrangement as claimed in claim 22 comprising a capacitive network that decouples said second and third radio-frequency antennas from each other, and wherein said first tuning element of said first radio-frequency antenna suppresses a common mode signal between said second and third radio-frequency antennas.

24. A radio-frequency antenna arrangement as claimed in claim 23 wherein each of said feed lines has an adaptation capacitor connected therein, said adaptation capacitors being supported on said support structure.

25. A magnetic resonance system comprising:

a magnetic resonance data acquisition device comprising a basic field magnet, a gradient coil system, and a radio-frequency antenna arrangement; and said radio-frequency antenna arrangement comprising a radio-frequency antenna comprising two electrodes connected with each other via a discrete tuning device that tunes said radio-frequency antenna to a resonance frequency, said tuning device comprising a first tuning element that influences said resonant frequency of said radio-frequency antenna and a second tuning element that influences said resonance frequency of said radio-frequency antenna, said first and second tuning elements being connected in series and respectively functioning as inductors, and said radio-frequency antenna comprising two tap points at which a signal acquired by said radio-frequency antenna representing a magnetic resonance signal is tapped and conducted from said radio-frequency antenna via respective feed lines connected to said two tap points, the two tap points being respective between said electrodes and said first tuning element, and one of said tap points being between said first tuning element and said second tuning element.

* * * * *